(12) United States Patent
De Angelis et al.

(10) Patent No.: US 9,067,242 B2
(45) Date of Patent: Jun. 30, 2015

(54) METHODS FOR OBTAINING HOLLOW NANO-STRUCTURES

(75) Inventors: Francesco De Angelis, Genova (IT); Enzo Di Fabrizio, Rome (IT)

(73) Assignee: Fondazione Istituto Italiano di Tecnologia, Genoa (IT)

(*) Notice: Subject to any disclaimer, the term of this patent is extended or adjusted under 35 U.S.C. 154(b) by 0 days.

(21) Appl. No.: 13/978,407

(22) PCT Filed: Jan. 26, 2012

(86) PCT No.: PCT/IB2012/050366
§ 371 (c)(1),
(2), (4) Date: Jul. 5, 2013

(87) PCT Pub. No.: WO2012/101595
PCT Pub. Date: Aug. 2, 2012

(65) Prior Publication Data
US 2013/0284696 A1    Oct. 31, 2013

(30) Foreign Application Priority Data
Jan. 26, 2011 (IT) .............. TO2011A0066

(51) Int. Cl.
B31D 3/00 (2006.01)
B05D 3/06 (2006.01)
B81C 1/00 (2006.01)
B82Y 35/00 (2011.01)
G01Q 60/40 (2010.01)
G01Q 70/16 (2010.01)

(52) U.S. Cl.
CPC ............ *B05D 3/068* (2013.01); *B81C 1/00087* (2013.01); *B82Y 35/00* (2013.01); *G01Q 60/40* (2013.01); *G01Q 70/16* (2013.01)

(58) Field of Classification Search
USPC ......... 438/733, 735, 744; 216/27, 56; 369/13, 369/33; 75/371, 741
See application file for complete search history.

(56) References Cited

U.S. PATENT DOCUMENTS

| 4,919,749 | A | 4/1990 | Mauger et al. | |
|---|---|---|---|---|
| 6,143,190 | A * | 11/2000 | Yagi et al. ...................... | 216/27 |
| 6,215,114 | B1 | 4/2001 | Yagi et al. | |
| 8,114,305 | B2 * | 2/2012 | Komiyama et al. ............. | 216/27 |
| 2003/0185108 | A1 | 10/2003 | Song et al. | |
| 2004/0139794 | A1 | 7/2004 | Minne | |

* cited by examiner

*Primary Examiner* — Lan Vinh
*Assistant Examiner* — Maki Angadi
(74) *Attorney, Agent, or Firm* — Robert E. Alderson, Jr.

(57) ABSTRACT

Methods are provided for obtaining hollow nano-structures which include the steps of providing a suspended film starting layer on a support substrate, depositing on the starting layer a sacrificial layer, performing, in progressive sequence, a complete erosion phase of said support substrate and starting layer and performing an at least partial erosion phase of the sacrificial layer previously deposited on the starting layer so as to obtain holes passing through the starting layer and passing or non passing through the sacrificial layer, depositing, on the side of the support substrate opposite to that where the starting layer is put, at least one covering layer arranged to internally cover the holes created by the progressive erosion. Hollow nano-structures formed by such methods are also provided.

14 Claims, 3 Drawing Sheets

METHODS FOR OBTAINING HOLLOW NANO-STRUCTURES

CROSS-REFERENCE TO RELATED APPLICATIONS

This application is a National Phase Application of PCT International Application No. PCT/IB2012/050366, International Filing Date, Jan. 26, 2012, claiming priority to Italian Patent Application No. TO2011A000066, filed Jan. 26, 2011, both of which are hereby incorporated by reference in their entirety.

FIELD OF THE INVENTION

The present invention relates to a method for obtaining hollow nano-structures.

BACKGROUND OF THE INVENTION

It is known to manufacture nanometer-sized devices, such as, for example, cantilever for atomic force microscopes (AFMs), or probes for scanning near-field optical microscopes (SNOMs), by the use of lithography, dry etching or wet etching processes, use of ionic beams, etc.

However, such methods do not allow obtaining hollow nano-structures and/or changing the geometry of the section: circular, rectangular, elliptical, etc.

SUMMARY OF THE INVENTION

Object of the present invention is to propose a method for obtaining hollow nano-structures, which is quick to perform, and which allows obtaining nano-structures with a high control of the dimensions.

This and other objects are achieved by a method for obtaining hollow nano-structures, whose characteristics are defined in claim 1.

Particular embodiments are the subject of the dependant claims, the content of which is to be understood as an integral and integrating part of the present description.

Further characteristics and advantages of the present invention will be apparent from the following detailed description, given only by way of non-limiting example, with reference to the annexed drawings.

DETAILED DESCRIPTION

With reference to FIGS. 1 to 4, a method for obtaining hollow nano-structures, particularly nano-cones, nano-cylinders, nano-parallelepipeds, and nano-prisms, will be now described.

Figure 1:
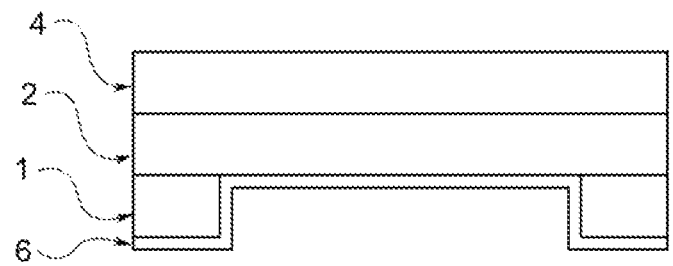
FIGS. 1 to 4 are longitudinal cross-sectional views of several intermediate steps of a method for obtaining hollow nano-structures according to the invention.

As shown in FIG. 1, on a support substrate 1, for example silicon, a starting layer 2 is deposited, which is a suspended film having a thickness comprised in the range between 50 nm and 3 µm, preferably 200 nm.

The assembly composed of the support substrate 1 and the starting layer 2 represents the starting substrate, which is a suspended film such as, for example, a membrane (comprising two layers) or a cantilever (comprising two layers) for atomic force microscopy (AFM).

Advantageously, the starting layer 2 is therefore a membrane or a cantilever for AFM in silicon or silicon nitride, having a thickness comprised in the range between 50 nm and 3 µm.

Alternatively, the starting layer 2 can be in silicon oxide, diamond, metal or plastic material.

A resist sacrificial layer 4 is deposited on the starting layer 2, preferably having a thickness comprised in the range between 30 nm and 10 µm, for example by spin coating.

By the term sacrificial is meant in the present description, a covering layer which is susceptible to be selectively removed with respect to the starting layer on which it has been deposited.

Advantageously, a photoresist, for example of the Shipley 1813 type, is used, thus obtaining a layer having a thickness of 2 nm by baking at 90° C. for 10 minutes.

The Shipley 1813 photoresist is easy to be deposited by spin coating, it is easily eroded with a Focused Ionic Beam (FIB), as it will be described below, and it is quickly removed with acetone without etching the other underlying materials.

Alternatively to the use of an ionic beam, it is possible to use a dry etching process, such as RIE (Reactive Ion Etching) or a mechanical erosion process, such as Ion Beam Milling, preceded by an electronic or optical lithography phase, as described below.

Alternatively to the use of the Shipley 1813 photoresist, any other type of resist, or plastic material, or inorganic material, which is deposable by means of spin coating or by means of a per se known evaporation phase, e.g., a Chemical Vapour Deposition (CVD) phase, or by means of sputtering or other per se known similar techniques, can be used as a sacrificial layer. In brief, the type of technique used to deposit the resist layer 4 is not critical, the only required characteristics being that the technique used is compatible with the materials of the support substrate 1 and the starting layer 2, and that the resist can be selectively removed with respect to such materials.

In case the substrate 1, the starting layer 2, and the sacrificial layer 4 are non-conductive, in order to facilitate the use of techniques requiring conductive samples (such as, for example, Focused Ion Beam (FIB) or electronic lithography), a conductive layer 6 having a thickness in the order of tens of nanometers, for example, a metallic layer such as gold having a thickness of 10 nm, is deposited on the side of the substrate 1 opposite to that where the starting layer 2 is put.

Alternatively to the metallic layer, it is possible to deposit other materials, such as graphites or conductive polymers.

Therefore, the addition of the conductive layer 6 is necessary only when all the used materials are insulating, and techniques requiring conductive samples are used, such as ionic beam etching or electronic lithography. For other techniques, such as, for example, optical lithography or RIE, it is not necessary to have a conductive layer; therefore this step can be omitted.

Figure 2:
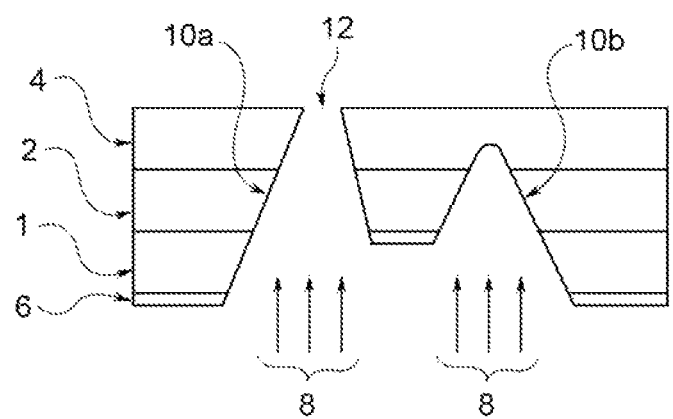

In FIG. 2, the subsequent erosion step using a focused ionic beam 8, for example, of gallium ions (firstly, erosion of the substrate 1, then of the starting layer 2, finally of the sacrificial layer 4) is illustrated.

Particularly, a complete erosion of the substrate 1 and the starting layer 2, and an at least partial erosion of the sacrificial layer 4 deposited on the starting layer 2 is carried out in a progressive sequence, as described below. By the term "complete erosion" is meant erosion leading to obtain a cavity, or slot, and not a complete removal of the layer.

Thus, conical-shaped holes 10a, 10b are obtained, which get to completely perforate the resist layer 4 at the top 12

(cone 10*a*), or not (cone 10*b*), according to the fact that a closed cone or a truncated cone is finally sought.

The conical shape is obtained by means of writing in polar coordinates circles having a progressively decreasing diameter, by using for example a ion current of 5 pA and a writing time of about 20 s for each cone.

Alternatively, it is possible to obtain non-conical structures, such as cylinders or parallelepipeds (i.e., structures having a constant cross-section along the main erosion axis), by carrying out a Reactive Ion Etching or Ion Beam Milling phase, preceded by a per se known lithographic phase for the definition of the section of the nano-structures.

The method hereto described provides that the creation of the hollow nano-structures proceeds according to successive erosions, in a progressive sequence, starting from the support substrate 1 towards the sacrificial layer 4. However, only in case of creation of open-top structures 12 (such as the cone 10*a*), it is possible to perform the erosion in an inverse direction, i.e., starting from the sacrificial layer 4 towards the support substrate 1 (e.g., performing an optical lithography on the sacrificial layer 4 for the definition of the holes, followed by a RIE etching for the removal of the underlying material).

Clearly, the section of the holes can be of any shape, for example circular, elliptical, polygonal, "C"- or "L"-shaped.

The section (base width) of the holes is preferably in the order of a few hundred nanometers or lower, e.g. comprised in the range between 50-400 nm. Such values refer to the dimensions of the section as considered at the starting layer 2, at the interface between the starting layer 2 and the support substrate 1. In the case of "C"- or "L"-shaped sections, the base width is the minimum dimension among those defining the section shape. For example, in the case of a "L", the width is the short leg of the "L", in the case of a "C", the width is the gap spanning the two tips of the same "C".

The height of the structures, in the case of open-top structures 12, is related to the thickness of the deposited sacrificial layer 4, while in the closed structures it depends on the depth of the slot.

Particularly, the nano-structures of the present invention have a height (the sum of the thicknesses of the starting layer 2 and the sacrificial layer 4, for open structures, or the sum of the thicknesses of the starting layer 2 and the depth of the slot, for closed structures), which is at least four-fold the width (section) of the holes.

Therefore, the shape of the nano-structures depends on the type of writing that is used: the use of FIB in polar coordinated creates conical hollow structures, while hollow parallelepipeds having a section defined by lithography are obtained by RIE and Ion Beam Milling.

Figure 3:
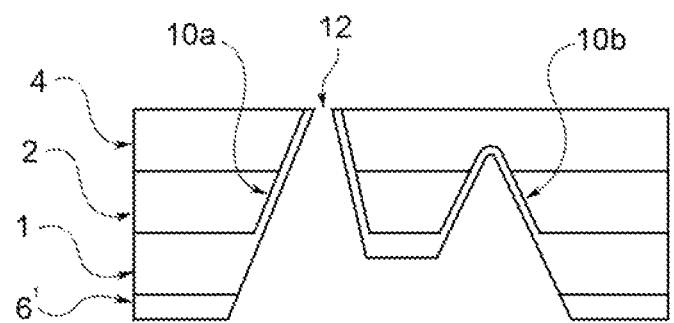

In FIG. 3, the successive deposition phase by means of sputtering of one or more covering layers 6', e.g., a metal layer having a chemical composition that is the same of that of the conductive layer 6, is shown, preferably having a total thickness comprised in the range between 30 nm and 500 nm, particularly a thickness of at least $\frac{1}{15}$ the width of the holes. The covering layer 6' is deposited on the side of the support 1 opposite to that where the starting layer 2 is put.

Alternatively, it is possible to remove the conductive layer 6 before the deposition of the layer 6'.

In the case of open-top structures (cone 10*a*), it occurs that the deposition of the covering layer 6' does not "close" the opening, thereby allowing increasing the inner thickness of the nano-structure walls. The open top feature is thereby preserved.

Advantageously, this covering layer 6' can be replaced by another metal having a chemical composition that is different from that of the conductive layer 6, or by any other material that is deposable, e.g., by means of sputtering, thermal evaporation, or electron-gun evaporation. It is also possible to use a dielectric material.

Advantageously, at the end of the process described before, a number of successive depositions are performed, of further covering layers with different materials, so as to obtain a layered structure. For example, a metal, a dielectric material, and also a metal can be deposited in a progressive way, so as to obtain coaxial structures having the starting shape (conical, cylindrical, etc.) that is obtained by the method according to the invention, and a thickness defined by overlapping these additional layers, in which the metal layers are mutually isolated by the dielectric material.

Figure 4:
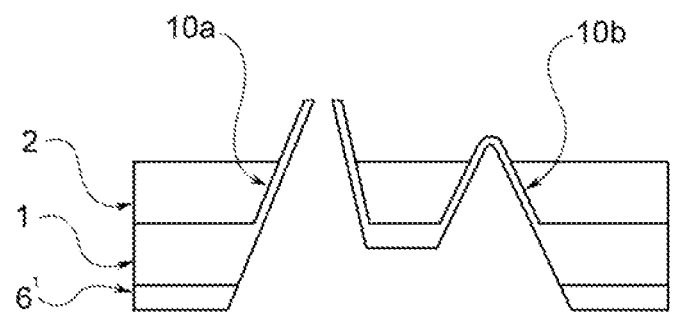

In FIG. 4, the sacrificial layer 4 is removed by immersion in hot acetone. In this way, the two cones 10*a* and 10*b* project from the starting layer 2 and can be used as devices, for example, tips of an AFM cantilever.

Alternatively, in case the sacrificial layer 4 does not hinder the operation of the device, or it is advantageous to do that, it is possible not to remove it.

The nano-structures of the present invention can have an axis that is substantially perpendicular to the starting substrate 2 or sloped with respect to such starting substrate 2.

Figure 5:
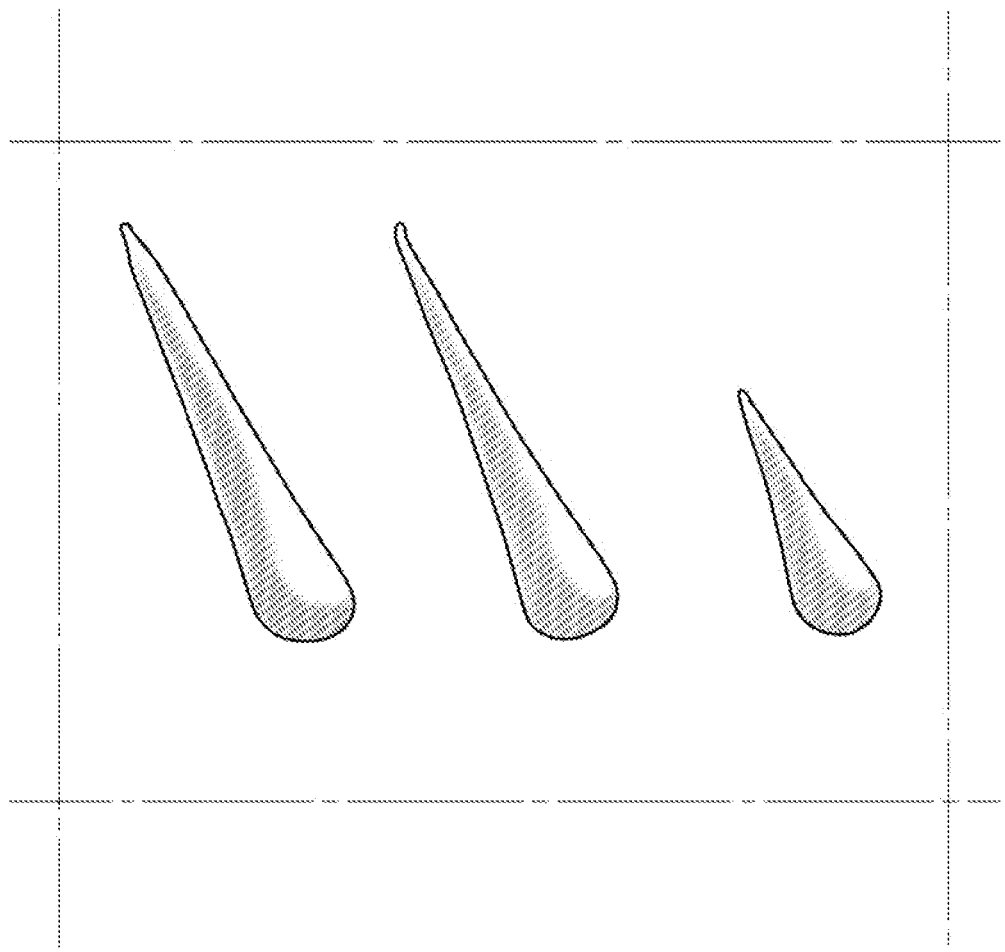
FIG. 5 is a perspective view of a variant of the nano-structures of the present invention.

In FIG. 4, the two cones 10*a* and 10*b* have their axis substantially perpendicular, while two cones with a sloped axis are shown in FIG. 5.

The main advantages associated to the present invention are:

- a high and precise control of the end dimensions of the nano-structures, particularly as regards the evenness and thickness of the covering layer 6', the slope and the aspect ratio of the side walls, etc.;
- obtaining hollow structures having different shapes only by changing the writing technique that is used;
- obtaining hollow nano-structures having nano- and micrometric dimensions with optoelectronic characteristics that are superior to those of the similar devices currently available;
- possibility to change the writing materials and techniques according to the needs;
- rapidity and simplicity in performing the method according to the invention;
- possibility to obtain coaxial structures formed by layers of different materials.

In case the covering layer 6' is deposited by evaporation, the results of the method according to the invention are achieved by exploiting at the best the phenomenon of the surface diffusion of the atoms forming such covering layer 6', as it will be described below.

The surface diffusion of a metal atom is a phenomenon that has been widely studied, in the nanomanufacturing field, for about 30 years. It is well known that, during the deposition of metal atoms by evaporation or sputtering, in some cases it is possible to obtain a significant deformation of the desired pattern. Particularly, the atoms travelling from the evaporation source to the substrate, either bounce back, or are adsorbed on the surface film. Those so-adsorbed atoms are called "adatoms".

The energy of the vapour atoms is much higher than that of the atoms in a film. Therefore, the new "adatoms" arriving on a surface film have an energy excess that will cause the diffusion thereof on the surface of the solid. Therefore, these "adatoms" keep moving on the film surface, while releasing the energy excess, until when they are buried below newly arrived vapour atoms on the surface film, or when they are trapped by chemisorption or go away from the surface. For example, the average diffusion distance for gold is about 100-300 nm at 300 K for a deposition time of 500 seconds, although the surface heating caused by the radiation and metal condensation can lead to an increase of the diffusion distance.

The diffusion process can be very different from metal to metal (e.g., noble metals diffuse over longer distances with respect to other metal, such as chrome). However, there are many parameters affecting the diffusion distance: temperature of the substrate, initial surface, presence of impurities, deposition conditions (pressure, speed, incidence angle), etc.

The deposition of a film can be divided into three successive phases: nucleation, coalescence, and film growth.

The initial phase (nucleation) is dictated by the interaction between the substrate and the "adatoms".

In the second phase, the nuclei of the so-formed crystals expand until forming a continuous metal film (coalescence stage).

After the coalescence stage, the metal film keeps growing until the evaporation terminates.

The nucleation and coalescence phases, although they persist only during a fraction of the total evaporation time, have a major influence on the film structure, because they determinate the properties thereof. Unlike the final phase, they are governed by the substrate"adatom" interactions, rather than by the metal surface-"adatoms" surface interactions. For this reason, not only the starting substrates play a crucial role in the evaporation process, but also the physical state at the molecular level (local roughness, presence of bonds, impurities) affects the result of the creation of a thin coating film.

For typical substrates, such as glass, silicon, resist (for optical lithography and electronic beam), the surface diffusion during nucleation is greater than during the film growth, since the metal-metal bonds are stronger than the metal-substrate bonds.

As mentioned before, the deposition parameters also play an important role. Among them, the evaporation incidence angle (the angle between the substrate surface and the evaporation direction) is crucial.

It is known that oblique evaporation angle can heavily affect the surface diffusion along the slope direction. This phenomenon is still partially unclear, but it is believed that it is related to the parallel momentum conservation.

Considering an atom that arrives at the substrate surface with a given angle (therefore, not perpendicularly), in order to become an "adatom" it only has to "lose" its kinetic energy component that is perpendicular to the surface, but it can maintain its parallel component.

Thank to that, there is the possibility that those atoms arriving obliquely to the substrate travel faster than atoms arriving perpendicularly to such substrate. Particularly, at perpendicular incidence angles, the atoms scatter in all the direction parallel to the surface, while at an increasing incidence angle, they travel more and more in the direction parallel to the ejecting direction of the vapour beam on the film surface.

Consequently, the atoms exhibit an increasing directional surface diffusion, as the deposition angle increases.

Therefore, it is well known that the angle of incidence of the atoms strongly affect the surface diffusion. Particularly, in the nano-manufacturing technologies, patterns that are already present on the surface (typically, lithographic patterns) strongly affect the surface diffusion. For example, a fold in the surface prevents a further diffusion beyond the fold. This measure is typically used in the lithographic patterns (lift-off techniques) in order to allow the formation of discontinuous metal films. On the other hand, in the absence of barriers, e.g., resist patterns, the diffusion of the "adatoms" to the edge of the deposited metal film increases the edge profile.

When mask deposition techniques are used, such a displacement of the edge profile leads to a deformation of the mask.

Turning back to the hollow nano-structures of the present invention, they have side walls that are almost parallel to the direction from which the atoms of the covering layer 6' arrive, in the case of evaporation (see FIG. 2, where the arrows of the focused ionic beam 8 also represent the direction from which the atoms of the covering layer 6' arrive). The slope of the side walls thus promotes a strong diffusion of such atoms of the covering layer 6' and a progressive migration of the edge of such covering layer 6' (while it is being created) from the base to the top of the nano-structures, which are crucial when nano-structures with a very high aspect ratio have to be achieved.

In order to confirm this idea, nano-structures have been produced, having an axis that forms an angle of 60° with the starting substrate (instead of an angle of 90° as the above-described cones). In this case, therefore, the evaporation direction of the atoms of the covering layer 6' was almost perpendicular to the side walls of the nano-structures.

The footprints of the gold atoms that have directly hit the walls of the same nano-structures, without migrating to the top have been observed at the base of the nano-structures.

This aspect becomes very critical when nano-cones or nano-cylinders with a high aspect ratio are sought (low vertex angles of cone, or very high ratios between height and diameter of the cylinders).

In a cylindrical structure, when the base diameter is comparable to the thickness of the evaporated metal, the metal film tends to obstruct the base of the nano-cylinder, thus preventing the metal atoms to create a continuous film. This problem does not affect the micro-structures, but only the nano-structures.

Therefore, with nano-structures such as those of the present invention, it is crucial to have a good surface diffusion.

In order to show the significance of the surface diffusion, gold nano-cylinders having a height of 5 µm and a base of 200 nm (25:1 aspect ratio) have been produced. By evaporating a gold covering layer 6' having a thickness of 100 nm, a thin film is obtained on the side walls having a thickness of about 30 nm. This means that the volume of the gold atoms directly hitting the cylinder base is $3*10^6$ nm$^3[\pi*100^2*100]$, while the final volume of the structure is $7*10^7$ nm$^3[\pi*(100^2-70^2)*5000]$.

The difference between these two values represents the amount of gold that entered the hollow structure by means of surface diffusions, instead of by direct impact.

It is apparent that diffusion prevails over a direct impact. This is only possible if the open footstep of the starting substrate is more efficient in trapping the "adatoms" of the covering metal with respect to the non-eroded nearest areas.

Therefore, in the method of the present invention, the combination of geometrical factors, deposition conditions, and surface states is determinant for the success of the process.

Clearly, the principle of the invention being understood, the embodiments and the implementation details will be able to be widely changed with respect to what has been described and illustrated by way of a non-limiting example, without for this departing from the scope of the invention as defined in the annexed claims.

The invention claimed is:

1. A method for obtaining hollow nano-structures comprising the steps of:
   providing a suspended film starting layer on a support substrate;
   depositing on the starting layer a sacrificial layer;
   performing, in progressive sequence, a complete erosion phase of said support substrate and starting layer and performing an at least partial erosion phase of the sacrificial layer deposited on the starting layer so as to obtain holes in the starting layer and optionally in the sacrificial layer; and
   depositing, on the side of the support substrate opposite to that of the starting layer, at least one coating layer arranged to internally coat the holes created by the at least partial erosion phase,
   wherein the at least one coating layer provides said hollow nano-structures.

2. The method of claim 1, wherein the erosion phase is performed in a progressive way starting from the support substrate, proceeding to the starting layer and ending by eroding at least partially the sacrificial layer.

3. The method of claim 1, wherein, in case of creation of holes passing through the sacrificial layer, the erosion phase is performed in a progressive way starting from the sacrificial layer, proceeding to the starting layer and ending by eroding the support substrate.

4. The method of claim 1, wherein said erosion phase is performed using a technique selected from the group consisting of: Focused Ion Beam, Reactive Ion Etching, Ion Beam Milling and combinations thereof, and wherein the Reactive Ion Etching and the Ion Beam Milling are preceded by an electronic or optical lithography phase for the definition of the section of the nano-structures.

5. The method of claim 4, wherein the support substrate, the starting layer and the sacrificial layer are non-conductive layers and wherein, in the case of use of the Focused Ion Beam or the electronic lithography, the erosion phase is preceded by a deposition phase, on the back side of said support substrate, of a conductive layer arranged to make the support substrate conductive.

6. The method of claim 1, further comprising a final step of removing the sacrificial layer.

7. The method of claim 1, wherein the starting layer is selected from the group consisting of: silicon nitride, silicon oxide, diamond, metal, plastic material and combinations thereof.

8. The method of claim 1, wherein the sacrificial layer is selected from the group consisting of: photoresist, plastic material, inorganic material and combinations thereof.

9. The method of claim 1, wherein the coating layer is a metallic or dielectric layer.

10. The method of claim 1, wherein the sacrificial layer is deposited using techniques selected from the group consisting of: spin coating, evaporation, sputtering and combinations thereof.

11. The method of claim 1, further comprising the steps of sequentially depositing a plurality of coating layers of different materials so as to obtain coaxial structures.

12. The method of claim 1, wherein the starting layer thickness is between about 50 nm and about 3 μm.

13. The method of claim 1, wherein the sacrificial layer thickness is between about 30 nm and about 10 μm.

14. The method of claim 1, wherein the coating layer thickness is between about 30 nm and about 500 nm.

* * * * *